(12) United States Patent
Lou (10) Patent No.: US 7,852,667 B2
(45) Date of Patent: Dec. 14, 2010

(54) ST-RAM EMPLOYING A MAGNETIC RESONANT TUNNELING DIODE AS A SPACER LAYER

(75) Inventor: Xiaohua Lou, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 136 days.

(21) Appl. No.: 12/258,476

(22) Filed: Oct. 27, 2008

(65) Prior Publication Data

US 2010/0103727 A1    Apr. 29, 2010

(51) Int. Cl.
*G11C 11/14* (2006.01)
(52) U.S. Cl. .................. 365/171; 365/175; 365/105; 365/72
(58) Field of Classification Search .............. 365/171, 365/175, 105, 173, 72; 327/25, E29.072
See application file for complete search history.

(56) References Cited

U.S. PATENT DOCUMENTS

| | | | | |
|---|---|---|---|---|
| 5,191,223 | A | * | 3/1993 | Munekata .................. 257/421 |
| 5,646,419 | A | * | 7/1997 | McCaldin et al. ............ 257/13 |
| 6,703,645 | B2 | | 3/2004 | Ohno |
| 6,842,368 | B2 | * | 1/2005 | Hayakawa .................. 365/173 |
| 6,965,522 | B2 | * | 11/2005 | Lung et al. ................. 365/171 |
| 7,037,807 | B1 | * | 5/2006 | Murakami et al. .......... 438/466 |
| 7,138,648 | B2 | * | 11/2006 | Kneissl et al. ................ 257/14 |
| 7,430,135 | B2 | | 9/2008 | Huai |
| 7,485,503 | B2 | * | 2/2009 | Brask et al. ................. 438/142 |
| 7,486,551 | B1 | | 2/2009 | Li |
| 7,486,552 | B2 | | 2/2009 | Apalkov |
| 7,489,541 | B2 | | 2/2009 | Pakala |
| 7,518,835 | B2 | | 4/2009 | Huai |
| 7,576,956 | B2 | | 8/2009 | Huai |
| 2005/0282379 | A1 | | 12/2005 | Saito |
| 2007/0096229 | A1 | | 5/2007 | Yoshikawa |
| 2007/0230233 | A1 | | 10/2007 | Takahashi |
| 2008/0310219 | A1 | | 12/2008 | Chen |
| 2009/0050991 | A1 | | 2/2009 | Nagai |
| 2009/0302403 | A1 | | 12/2009 | Nguyen |

OTHER PUBLICATIONS

J.A. Folk et al., A Gate-Controlled Bidirectional Spin Filter Using Quantum Coherence, Science, vol. 299, Jan. 31, 2003, pp. 679-682.
New Class of Materials: Half-Metallic Ferromagnets, R.A. de Groot, F.M. Mueller, P.G. Engen, and K.H. Buschow, Physics Review Letters, 50, 2024 (1983).
Vurgaftman et al., Spin-Polarizing Properties of the InAs/(AISb)/GaMnSb/(AISb/InAs Ferromagnetic Resonant Interband Tunneling Diode, Physical Review B 67, 12509 (2003).
U.S. Appl. No. 12/175,545, filed Jul. 18, 2008, Lou.
U.S. Appl. No. 12/258,492, filed Oct. 27, 2008, Lou.
U.S. Appl. No. 12/258,491, filed Oct. 27, 2008, Lou.

* cited by examiner

*Primary Examiner*—David Lam
(74) *Attorney, Agent, or Firm*—Campbell Nelson Whipps LLC (57) ABSTRACT

A memory cell that includes a first magnetic layer, the magnetization of which is free to rotate under the influence of spin torque; a tunneling layer comprising a magnetic resonant tunneling diode (MRTD); and a second magnetic layer, wherein the magnetization of the second magnetic layer is pinned, wherein the tunneling layer is between the first magnetic layer and the second magnetic layer.

24 Claims, 6 Drawing Sheets

ST-RAM EMPLOYING A MAGNETIC RESONANT TUNNELING DIODE AS A SPACER LAYER

BACKGROUND

New types of memory have demonstrated significant potential to compete with commonly utilized forms of memory. For example, non-volatile spin-transfer torque random access memory (referred to herein as "ST-RAM") has been discussed as a "universal" memory. Techniques, designs and modifications designed to improve currently utilized structures and materials remain an important area of advancement to maximize the advantages of ST-RAM.

BRIEF SUMMARY

Disclosed herein is a memory cell that includes a first magnetic layer, the magnetization of which is free to rotate under the influence of spin torque; a tunneling layer comprising a magnetic resonant tunneling diode (MRTD); and a second magnetic layer, wherein the magnetization of the second magnetic layer is pinned, wherein the tunneling layer is between the first magnetic layer and the second magnetic layer.

Also disclosed herein is a method that includes switching a memory cell from a high resistance state to a low resistance state by passing a first forward bias voltage pulse having a first polarity through a diode and the memory cell; and switching the memory cell from the low resistance state to the high resistance state by passing a second forward bias voltage pulse having the first polarity through the diode and the memory cell, wherein the memory cell includes a first magnetic layer, the magnetization of which is free to rotate under the influence of spin torque; a tunneling layer comprising a magnetic resonant tunneling diode (MRTD); and a second magnetic layer, wherein the magnetization of the second magnetic layer is pinned and wherein the tunneling layer is between the first magnetic layer and the second magnetic layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

Figure 9A:
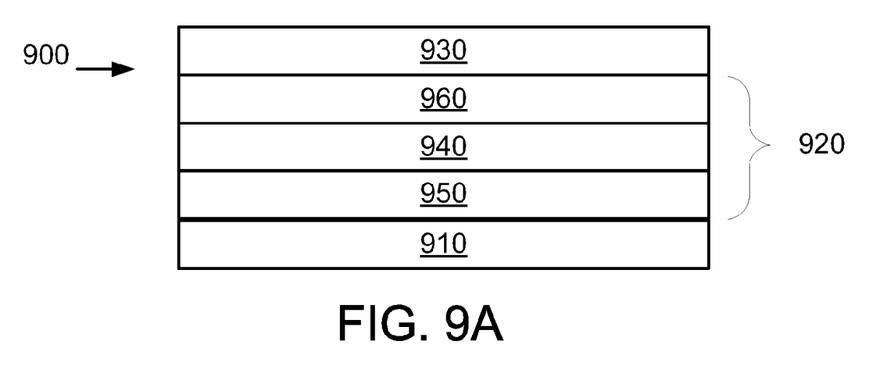

FIG. 9A illustrates an embodiment of a memory cell 900 that includes a first magnetic layer 910, a second magnetic layer 930 and a tunneling layer 920. In the embodiment of FIG. 9A, the tunneling layer 920 is a MRTD and includes a quantum well layer 940 between a first barrier layer 950 and a second barrier layer 960. The various layers of the memory cell 900 can be as described above.

Figure 9B:
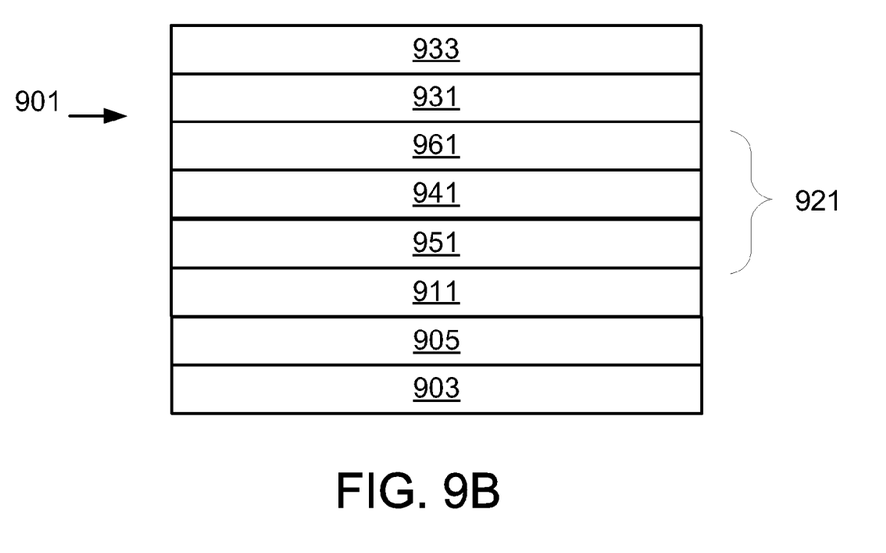

FIG. 9B illustrates an embodiment of a memory cell 901 that includes a first magnetic layer 911, a second magnetic layer 931 and a tunneling layer 921. In the embodiment of FIG. 9B, the tunneling layer 921 is a MRTD and includes a quantum well layer 941 between a first barrier layer 951 and a second barrier layer 961. The memory cell 901 can also include a first electrode 903 and a second electrode 933. The first magnetic layer 911 can also be pinned in this embodiment, by an antiferromagnetic layer 905. The various layers of the memory cell 901 can be as described above.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Figure 1:
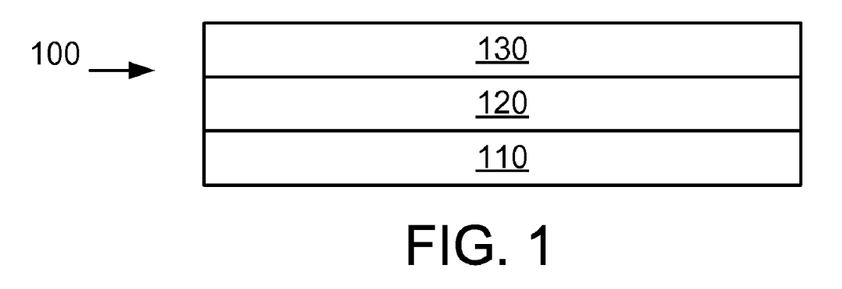
FIG. 1 is an illustration of a memory cell.

An embodiment of a memory cell 100 as disclosed herein, illustrated in FIG. 1, includes a first magnetic layer 110 and a second magnetic layer 130. A memory cell 100 also includes a tunneling layer 120 located between the first magnetic layer 110 and the second magnetic layer 130. The tunneling layer 120 generally includes a material that affects electrons of different spins differently. In an embodiment, a memory cell as disclosed herein can include a tunneling layer 120 that includes a magnetic resonant tunneling diode (referred to herein as a "MRTD").

Figure 2:
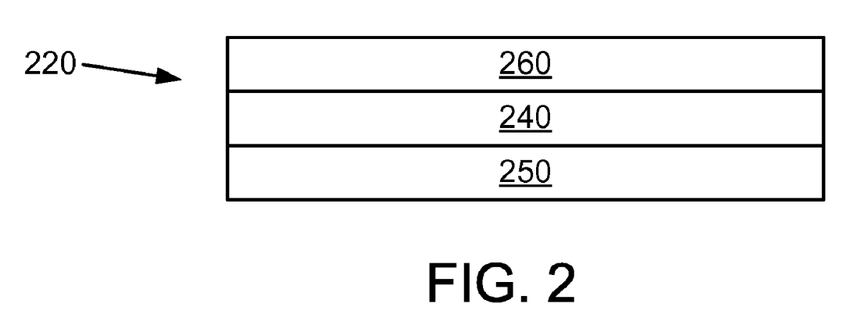
FIG. 2 is an illustration of a magnetic resonant tunneling diode.

A MRTD generally includes a layer of a material that affects electrons of different spins differently (also referred to herein as a "quantum well layer") and two barrier layers on either side of the quantum well layer. FIG. 2 illustrates an embodiment of a MRTD. The exemplary MRTD 220 includes a quantum well layer 240 between a first barrier layer 250 and a second barrier layer 260. Generally, the quantum well layer 240 is made of one type of semiconductor material and the first barrier layer 250 and the second barrier layer 260 are made of a second type of semiconductor material.

A MRTD such as that described herein generally functions as follows. When a voltage is applied to the MRTD, electrons resonantly tunnel from the conduction band of the barrier material through the valence band of the quantum well and back to the conduction band of the barrier. In this way, a MRTD differs from other tunneling structures because the output of a MRTD is a current of spin-polarized electrons rather than holes.

In an embodiment, the quantum well layer 240 can include any material that affects electrons of different spins differently. Exemplary materials that can be utilized include, but are not limited to, materials that include a Group III element, manganese and a Group V element, or the combination of Group II and Group VI elements. Exemplary Group III elements include boron (B), aluminum (Al), gallium (Ga), indium (In) and thallium (Tl). Exemplary Group V elements include nitrogen (N), phosphorus (P), arsenic (As), antimony (Sb) and bismuth (Bi). Exemplary Group II elements include, but are not limited to, beryllium (Be), magnesium (Mg), calcium (Ca), strontium (Sr), barium (Ba) and radium (Ra). Exemplary Group VI elements include, but are not limited to, oxygen (O), sulfur (S), selenium (Se), tellurium (Te) and polonium (Po). In an embodiment, gallium manganese antimony (GaMnSb) or gallium manganese arsenic (GaMnAs) can be utilized. In an embodiment, gallium manganese antimony (GaMnSb) can be utilized.

In an embodiment, the first barrier layer 250 and the second barrier layer 260 can include semiconductor materials that have a larger band gap than quantum well materials. In an embodiment, the first barrier layer 250 and the second barrier layer 260 can be made of materials that include aluminum, gallium, arsenic, indium, antimony, or combinations thereof. In an embodiment, the first barrier layer 250 and the second barrier layer 260 can be made of materials that include aluminum gallium arsenide (AlGaAs), indium aluminum arsenide (InAlAs), aluminum arsenide (AlAs), aluminum antimony (AlSb), indium arsenide (InAs), or combinations thereof.

In an embodiment, the quantum well layer has a thickness in the range of about 1 nanometer to about 20 nanometers. In an embodiment, the first barrier layer and second barrier layer have thicknesses in the range of about 0.5 nanometers to about 50 nanometers. The first barrier layer and the second barrier layer need not have the same thickness.

In an embodiment, a MRTD that can be utilized as a tunneling layer of a memory cell that includes a first magnetic layer, a five-layer structure, and a second magnetic layer. One such exemplary five-layer structure of MRTD includes n-layers of InAs, a 12 angstrom (Å) layer of AlSb, a 82 Å layer of $Ga_{0.95}Mn_{0.05}Sb$, a 12 Å layer of AlSb and InAs. Such a structure can be integrated between the first magnetic layer and the second magnetic layer to form a sandwich structure. The n-layers of InAs in this exemplary MRTD can be replaced by other small band gap semiconductors or can even be removed in a final structure.

Figure 3:
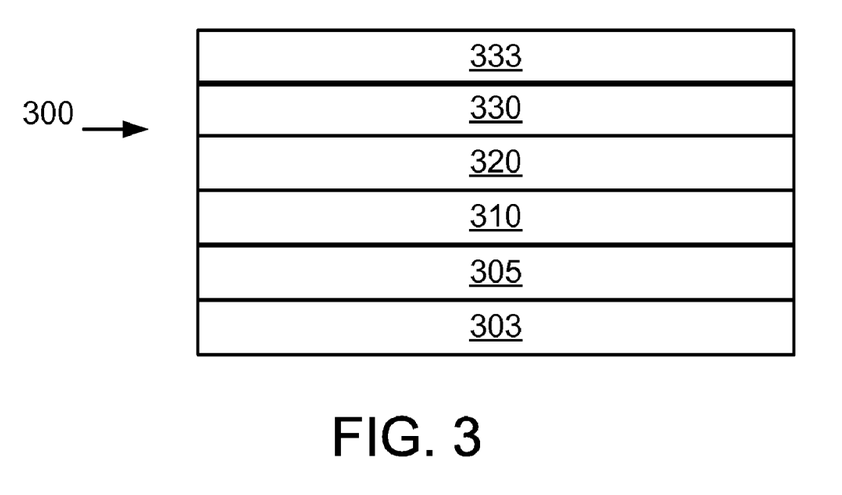
FIG. 3 is an illustration of a memory cell.

An exemplary embodiment of a memory cell is illustrated in FIG. 3. The cell in FIG. 3 includes a first magnetic layer 310, a second magnetic layer 330 and a tunneling layer 320 as discussed above. The tunneling layer 320 can include a MRTD as discussed above. The exemplary memory cell 300 also includes an antiferromagnetic layer 305, a first electrode 303 and a second electrode 333.

The first electrode 303 and the second electrode 333 electrically connect the first magnetic layer 310 and the second magnetic layer 330 respectively to a control circuit (not shown) that provides read and write currents through the magnetic layers. The relative orientation of the magnetization vectors of the first magnetic layer 310 and the second magnetic layer 330 can be determined by the resistance across the memory cell 300.

The magnetization layer of one of the magnetic layers, for example the first magnetic layer 310 is generally pinned in a predetermined direction, while the magnetization direction of the other magnetic layer, for example the second magnetic layer 130 is free to rotate under the influence of a spin torque. Pinning of the first magnetic layer 310 may be achieved through, e.g., the use of exchange bias with an antiferromagnetic layer 305. The antiferromagnetic layer 305 generally includes antiferromagnetically ordered material such as PtMn, IrMn and others for example.

Figure 4A:
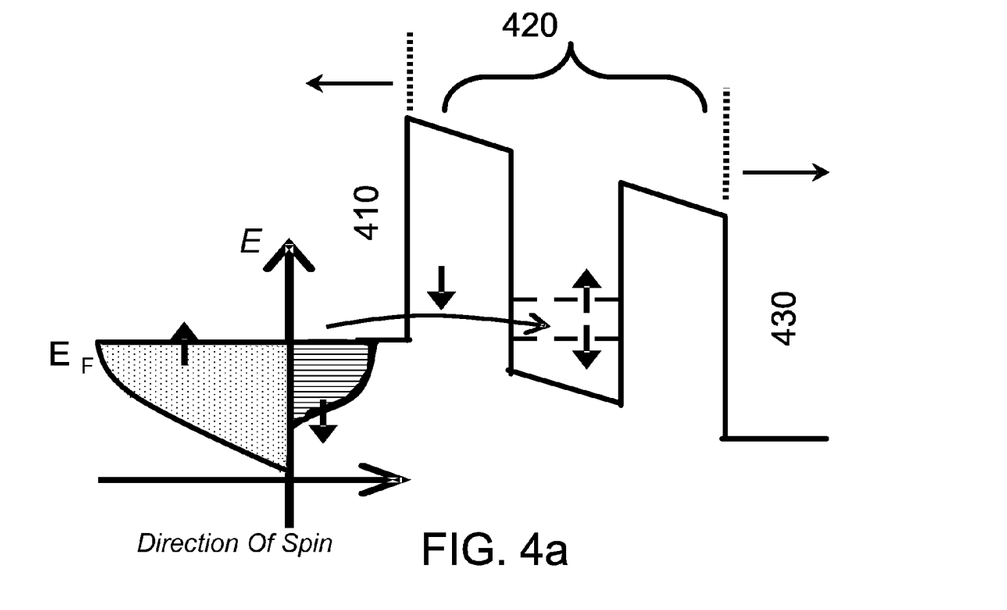
FIGS. 4a and 4b are diagrammatic illustrations explaining how a memory cell as disclosed herein functions when a low bias (FIG. 4a) and a high bias (FIG. 4b) are applied thereto.
Figure 4B:
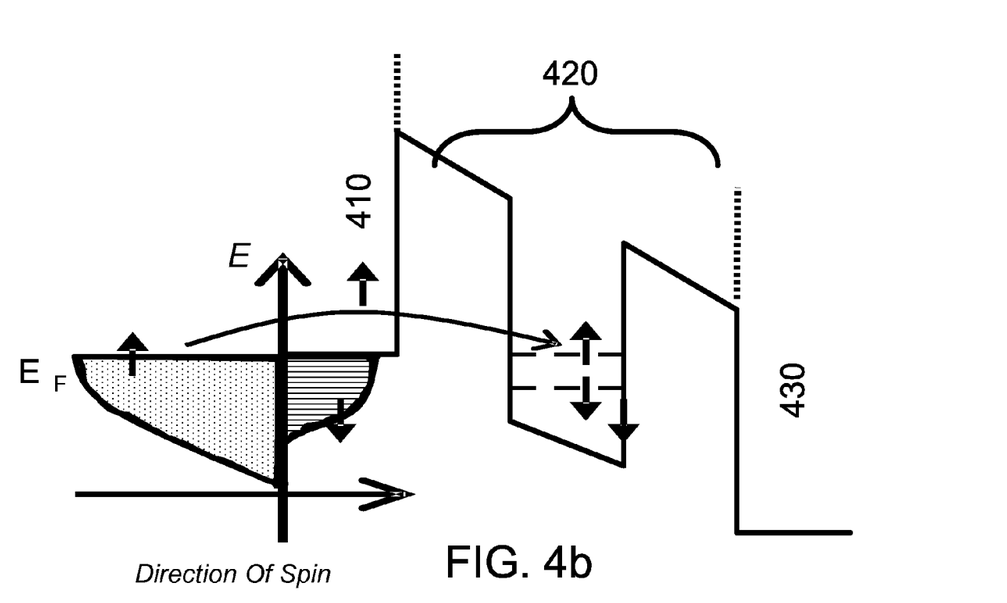

Memory cells as disclosed herein that utilize a tunneling layer as described herein will generally function slightly different than ST-RAM cells not using such a layer. The way in which such memory cells function is graphically depicted in FIGS. 4a and 4b. As depicted in FIG. 4a, when a small bias is applied to a memory cell as disclosed herein, the energy level of the spin-down electrons of the first magnetic layer 410 will align with the spin-down energy level of the tunneling layer 420. Under such circumstances, spin-down electron tunneling through the tunneling layer 420 dominates because of resonant tunneling. As shown in FIG. 4b, when a high bias is applied to a memory cell as disclosed herein, the energy level of the spin-up electrons of the first magnetic layer 410 will align with the spin-up energy level of the tunneling layer. Under such circumstances, spin-up electron tunneling through the tunneling layer 420 dominates because of resonant tunneling. Therefore, the spin polarization of the current tunneling across the tunneling layer 420 changes sign when a low or high bias (respectively) is applied to the memory cell. The spin transfer torque will therefore have a similar sign change as a function of the bias voltage. Thus, a small bias can be used to switch the free magnetic layer to one direction (either parallel or anti-parallel to the pinned magnetic layer) and a higher bias can be used to switch the free magnetic layer to the other direction (either anti-parallel or parallel to the pinned magnetic layer). However, it should be noted that the bias, whether low or high has the same polarity regardless of the direction the free layer is being switched to. This is referred to as unipolar spin transfer switching.

Figure 5:
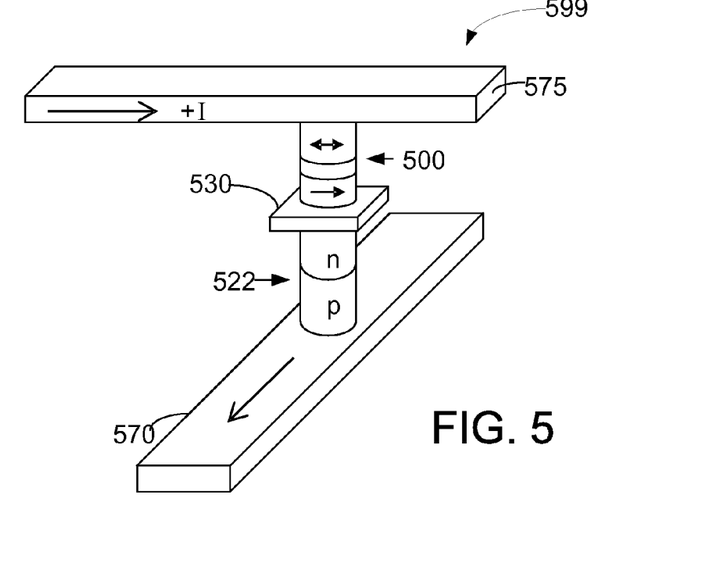
FIG. 5 is an illustration of a 1D1MTJ structure that can be utilized with memory cells.

Unipolar spin transfer switching can be advantageous when compared with bipolar spin transfer switching. Unipolar spin transfer switching can take advantage of the more simplistic 1D1MTJ (1 diode, 1 MTJ) structure that is depicted in FIG. 5 because it does not require a metal oxide semiconductor field effect transistor (MOSFET) to obtain bipolar voltages. A 1D1MTJ design has only two terminals (a bit line and a word line) and does not include a gate contact for the transistor. A gate contact is utilized with a MOSFET but is not required for a diode. A 1D1MTJ structure, such as that exemplified in FIG. 5 further benefits from not requiring a cumbersome MOSFET, which therefore allows for an increase in memory density and simpler design and fabrication processes.

The memory device 599 includes a memory cell 500 electrically coupled to a bit line 575 and a word line 570. In the illustrated embodiment, the bit line 575 and a word line 570 are orthogonal to each other and form a cross-point where the diode 522 and the memory cell 500 are located therebetween. In an embodiment, the diode 522 is a p-n diode. The memory cell 500 is configured to switch between a high resistance state and a low resistance state by passing a unipolar voltage through the memory cell 500. A diode 522 is electrically coupled between the memory cell 500 and the word line 570. In other embodiments, the diode 522 is electrically coupled between the memory cell 500 and the bit line 575 (not shown). A connecting layer 530 is illustrated between the memory cell 500 and the diode 522. The connecting layer 530 can be an electrically conducting and nonmagnetic layer.

Figure 6A:
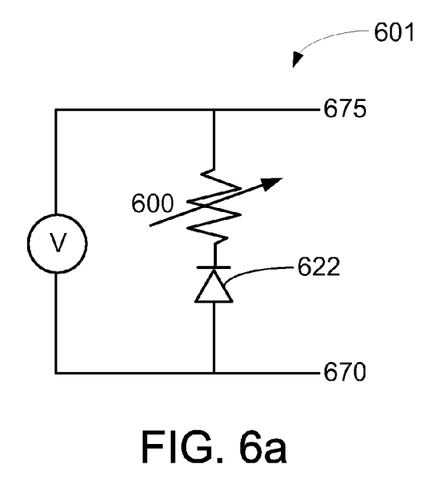
FIGS. 6a and 6b are schematic circuit diagrams of a memory device.
Figure 6B:
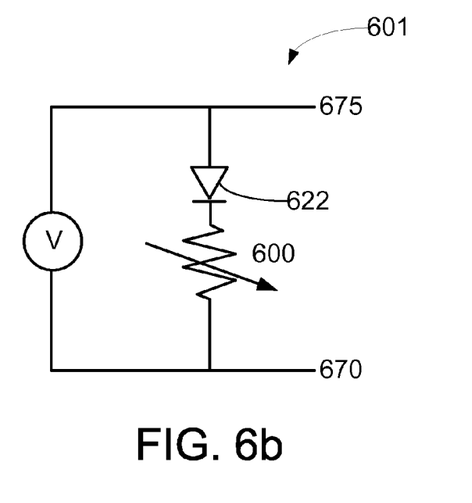

FIGS. 6a and 6b are schematic circuit diagrams of a memory device 601 that can be utilized with unipolar spin transfer switching. The memory device 601 includes a memory cell 600 as discussed above electrically coupled to a bit line 670 and a word line 675. The memory cell 600 is configured to switch between a high resistance state and a low resistance state by passing a unipolar voltage through the memory cell 600. A diode 622 is electrically coupled between the memory cell 600 and the word line 670. In other embodiments, the diode 622 can be electrically coupled between the memory cell 600 and the bit line 675, as illustrated in FIG. 6b. A voltage source V provides the unipolar voltage across the memory cell 600 to read or write the high resistance state and the low resistance state.

A diode allows an electric current to pass in one direction (referred to herein as the forward biased condition or "forward bias") and to block electrical current it in the opposite direction (the reverse biased condition or "reverse bias"). Thus, the diode can be thought of as an electronic version of a check valve.

In many embodiments, the voltage source V is a voltage pulse generator that is capable of generating a unipolar voltage pulse through the memory cell 600. In many embodiments, the voltage source V is a voltage pulse generator that is capable of generating a unipolar forward bias voltage pulse through the memory cell 600. The unipolar forward bias voltage pulse passes through the diode 622 in only the forward bias direction of the diode 622.

Figure 7:
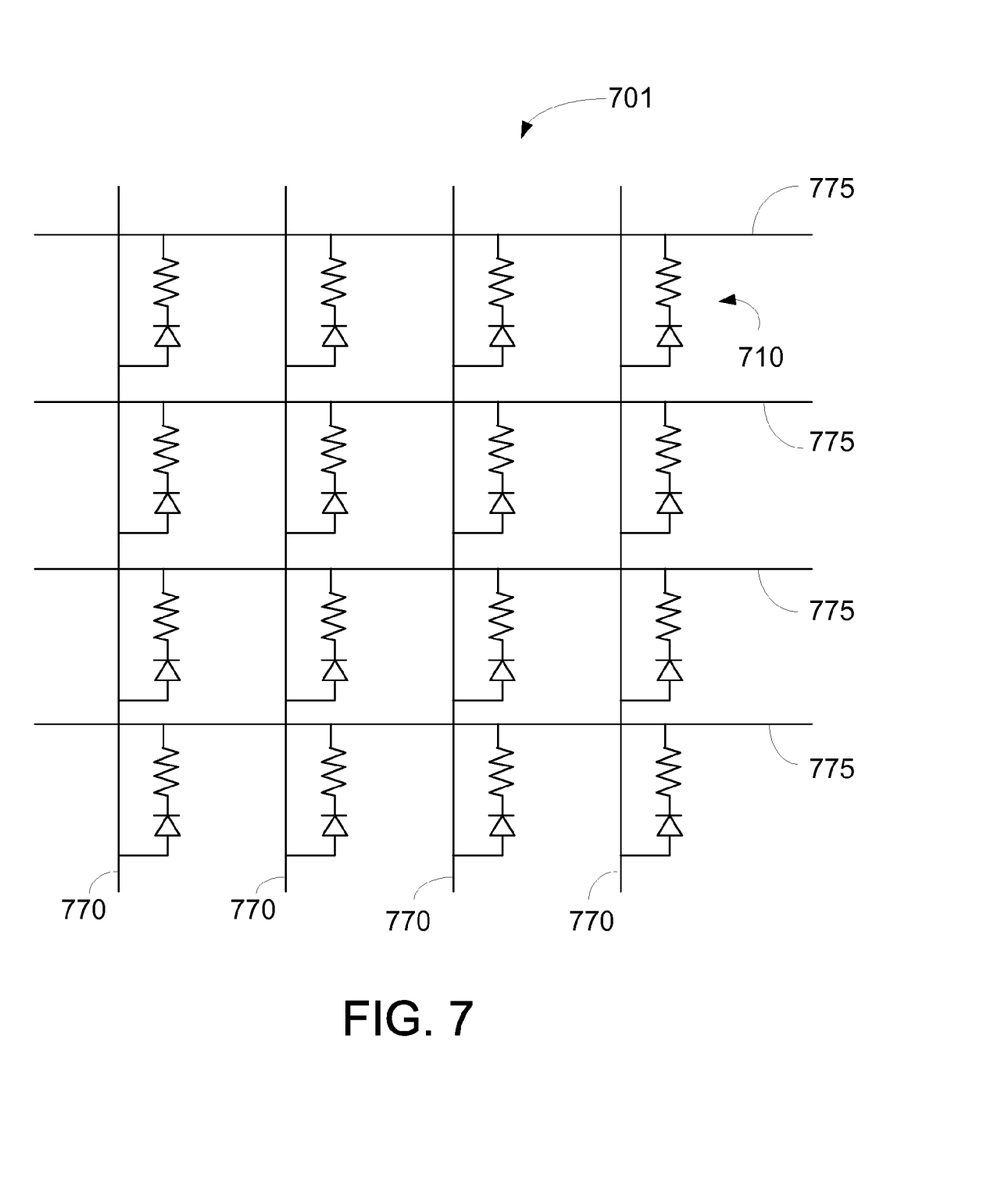
FIG. 7 is a schematic circuit diagram of an illustrative memory array.

FIG. 7 is a schematic circuit diagram of an illustrative memory array 701. A plurality of memory devices 710 (that includes a memory cell and a diode for example) can be arranged in an array to form the memory array 701. The memory array 701 includes a number of parallel conductive bit lines 775. The memory array 701 includes a number of parallel conductive word lines 770 that are generally orthogonal to the bit lines 775. The word lines 770 and bit lines 775 form a cross-point array where a memory device 710 is disposed at each cross-point. The memory device 710 and memory array 701 can be formed using conventional semiconductor fabrication techniques.

Figure 8:
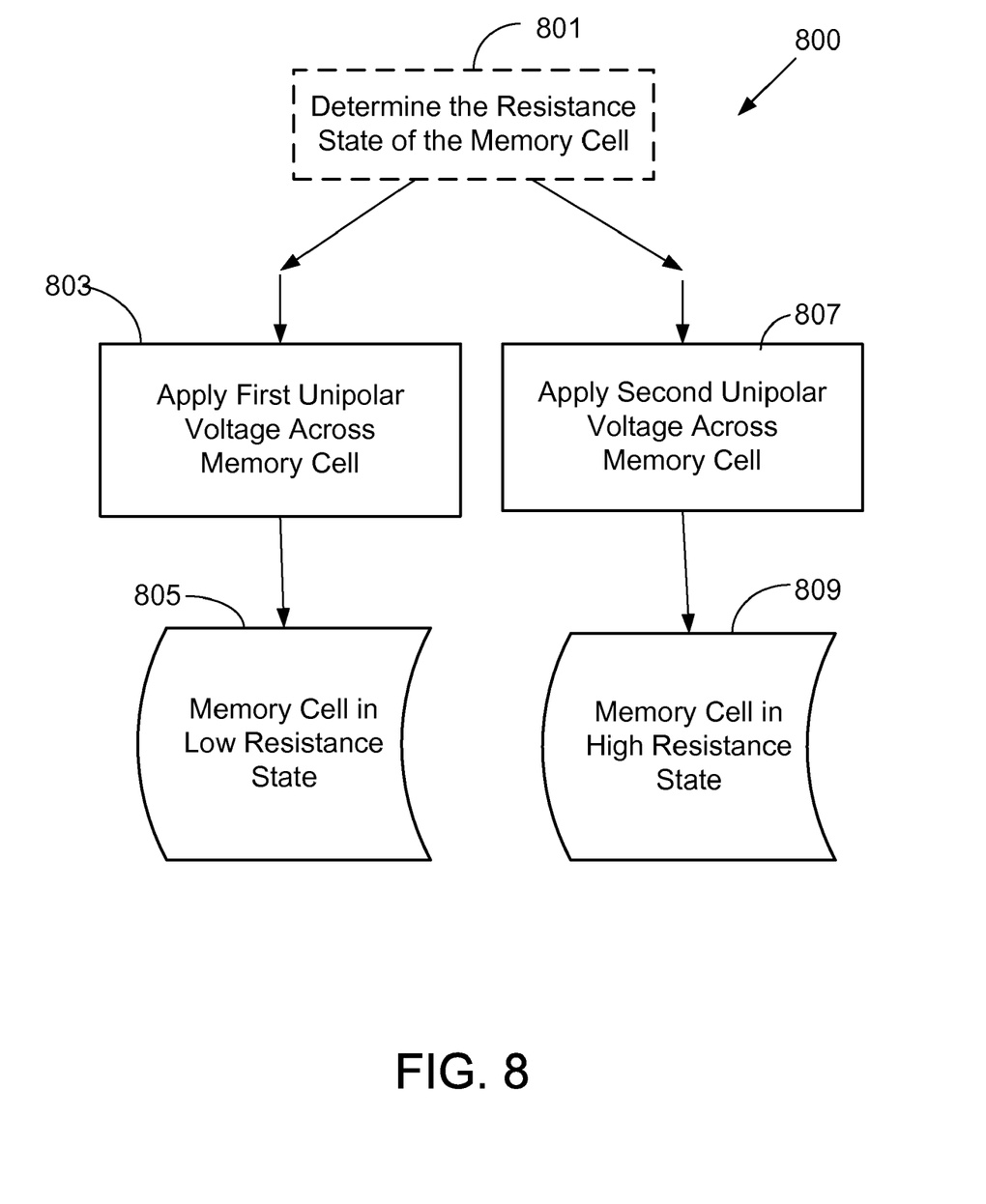
FIG. 8 is a flowchart illustrating a method of switching a magnetic tunnel junction data cell.

FIG. 8 is a flowchart illustrating a method 800 of switching a memory cell. Step 803 provides for switching the memory cell from a high resistance state to a low resistance state by passing a first forward bias voltage pulse having a first polarity through a diode and the memory cell. The first forward bias voltage pulse has a first magnitude. This will cause the memory cell to be in the low resistance state data state 805.

Step 807 provides for switching the memory cell from the low resistance state to the high resistance state by passing a second forward bias voltage pulse having the first polarity through the diode and the memory cell. The second forward bias voltage pulse has a second magnitude, which is greater than the first magnitude, as described above. This will cause the memory cell to be in the high resistance state data state 809. In an embodiment, the second voltage is at least about 2 times greater than the first voltage.

In an embodiment, a method can also include a step 801 of determining the resistance state of the memory cell. In an embodiment, the resistance state of the memory cell can be determined by utilizing the tunneling magnetoresistance with a small reading current. The resistance state of the memory cell can be determined by passing a third bias voltage pulse through the diode and the memory cell and comparing the voltage from the memory cell to a reference voltage. In an embodiment, the third bias voltage pulse can have a different polarity than the first and second bias voltage pulses, can be a lesser magnitude than the first and second bias voltage pulses, or a combination thereof.

Thus, embodiments of ST-RAM EMPLOYING A MAGNETIC RESONANT TUNNELING DIODE AS A SPACER LAYER are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A memory cell comprising:
    a first magnetic layer, the magnetization of which is free to rotate under the influence of spin torque;
    a tunneling layer comprising a magnetic resonant tunneling diode (MRTD); and
    a second magnetic layer, wherein the magnetization of the second magnetic layer is pinned,
    wherein the tunneling layer is between the first magnetic layer and the second magnetic layer.

2. The memory cell according to claim 1, wherein the MRTD comprises a quantum well layer that comprises a Group III element, a Group V element and manganese.

3. The memory cell according to claim 2, wherein the quantum well layer comprises a GaMnSb alloy.

4. The memory cell according to claim 2, wherein the quantum well layer has a thickness of about 1 nanometer to about 20 nanometers.

5. The memory cell according to claim 2, wherein the MRTD comprises a layered structure further comprising a first barrier layer and a second barrier layer, wherein the quantum well layer is positioned between the first barrier layer and the second barrier layer.

6. The memory cell according to claim 5, wherein the first and second barrier layers comprise AlSb.

7. The memory cell according to claim 1 further comprising a first electrode, a second electrode and an antiferromagnetic layer, wherein the antiferromagnetic layer is adjacent to the second magnetic layer, the first electrode is adjacent to the first magnetic layer and the second electrode is adjacent to the antiferromagnetic layer.

8. A memory device comprising:
    a memory cell comprising:
        a first magnetic layer, the magnetization of which is free to rotate under the influence of spin torque;
        a tunneling layer comprising a magnetic resonant tunneling diode (MRTD); and
        a second magnetic layer, wherein the magnetization of the second magnetic layer is pinned,
        wherein the tunneling layer is between the first magnetic layer and the second magnetic layer; and
    a diode.

9. The memory device according to claim 8, wherein the MRTD comprises a quantum well layer that comprises a Group III element, a Group V element and manganese.

10. The memory device according to claim 9, wherein the quantum well layer comprises a GaMnSb alloy.

11. The memory device according to claim 9, wherein the quantum well layer has a thickness of about 1 nanometer to about 20 nanometers.

12. The memory device according to claim 8, wherein the MRTD comprises a layered structure further comprising a first barrier layer and a second barrier layer, wherein the quantum well layer is positioned between the first barrier layer and the second barrier layer.

13. The memory device according to claim 12, wherein the first and second barrier layers comprise AlSb and the quantum well layer comprises GaMnSb.

14. The memory device according to claim 8 further comprising a word line and a bit line, wherein the memory cell and the diode are electrically coupled between the word line and the bit line.

15. The memory device according to claim 14, wherein the memory device does not include a gate contact to the diode.

16. The memory device according to claim 15, wherein the diode is a p-n diode.

17. The memory device according to claim 14 further comprising a plurality of memory cells, a plurality of diodes, a plurality of word lines and a plurality of bit lines, wherein the plurality of memory cells and the plurality of diodes are arranged in an array with the plurality of word lines and the plurality of bit lines connecting them.

18. A method comprising:
switching a memory cell from a high resistance state to a low resistance state by passing a first forward bias voltage pulse having a first polarity through a diode and the memory cell; and
switching the memory cell from the low resistance state to the high resistance state by passing a second forward bias voltage pulse having the first polarity through the diode and the memory cell,
wherein the memory cell comprises
a first magnetic layer, the magnetization of which is free to rotate under the influence of spin torque;
a tunneling layer comprising a magnetic resonant tunneling diode (MRTD); and
a second magnetic layer, wherein the magnetization of the second magnetic layer is pinned,
wherein the tunneling layer is between the first magnetic layer and the second magnetic layer.

19. The method according to claim 18 further comprising determining the resistance state of the memory cell by utilizing the tunneling magnetoresistance with a small reading current.

20. The method according to claim 18, wherein the first forward bias voltage pulse has a first magnitude, and the second forward bias voltage pulse has a second magnitude, and the second magnitude is in a range from 2 times greater than the first magnitude.

21. A device comprising:
a first magnetic layer, the magnetization of which is free to rotate under the influence of spin torque;
a tunneling layer comprising a magnetic resonant tunneling diode (MRTD); and
a second magnetic layer, wherein the magnetization of the second magnetic layer is pinned,
wherein the tunneling layer is between the first magnetic layer and the second magnetic layer.

22. The device according to claim 21, wherein the MRTD comprises a quantum well layer that comprises a Group III element, a Group V element and manganese.

23. The device according to claim 22, wherein the MRTD comprises a layered structure further comprising a first barrier layer and a second barrier layer, wherein the quantum well layer is positioned between the first barrier layer and the second barrier layer.

24. The device according to claim 21 further comprising a first electrode, a second electrode and an antiferromagnetic layer, wherein the antiferromagnetic layer is adjacent to the second magnetic layer, the first electrode is adjacent to the first magnetic layer and the second electrode is adjacent to the antiferromagnetic layer.

* * * * *